United States Patent [19]

Wronski

[11] Patent Number: 4,701,395

[45] Date of Patent: Oct. 20, 1987

[54] AMORPHOUS PHOTORECEPTOR WITH HIGH SENSITIVITY TO LONG WAVELENGTHS

[75] Inventor: Christopher R. Wronski, Annandale, N.J.

[73] Assignee: Exxon Research and Engineering Company, Florham Park, N.J.

[21] Appl. No.: 848,957

[22] Filed: Apr. 7, 1986

Related U.S. Application Data

[63] Continuation-in-part of Ser. No. 735,677, May 20, 1985, abandoned, which is a continuation-in-part of Ser. No. 703,083, Feb. 19, 1985, abandoned.

[51] Int. Cl.$^4$ .................. G03G 5/082; G03G 5/14; H01J 31/00; H01J 31/26
[52] U.S. Cl. ........................................ 430/58; 430/57; 313/386
[58] Field of Search ............ 430/57, 58; 313/384, 313/385, 386

[56] References Cited

U.S. PATENT DOCUMENTS

| | | | |
|---|---|---|---|
| 2,901,349 | 8/1959 | Schaffert et al. | 430/57 |
| 3,655,377 | 4/1972 | Sechak | 430/57 |
| 4,349,617 | 9/1982 | Kawashiri et al. | 430/58 X |
| 4,356,246 | 10/1982 | Tamei et al. | 430/58 X |
| 4,361,638 | 11/1982 | Higashi et al. | 430/58 |
| 4,378,417 | 3/1983 | Maruyama | 430/57 |
| 4,418,132 | 4/1983 | Yamazaki | 430/57 |
| 4,452,875 | 6/1984 | Ogawa et al. | 430/57 |
| 4,517,269 | 5/1985 | Shinizu et al. | 430/57 |
| 4,526,849 | 7/1985 | Van der Voort | 430/57 |

FOREIGN PATENT DOCUMENTS

| | | | |
|---|---|---|---|
| 123924 | 11/1984 | European Pat. Off. | 430/57 |
| 59-84254 | 5/1984 | Japan | 430/57 |
| 320802 | 12/1971 | U.S.S.R. | 430/57 |

*Primary Examiner*—Roland E. Martin
*Attorney, Agent, or Firm*—Ronald D. Hantman

[57] ABSTRACT

The present invention is a photoconductive member which includes a layer of amorphous semiconductor, adjacent to a multilayered amorphous semiconductor material, the composite material sandwiched between two blocking layers. The entire structure is supported by a layer of metal or glass depending on whether the photoconductive member is used in electrophotography or in an image pickup tube.

12 Claims, 8 Drawing Figures

AMORPHOUS PHOTORECEPTOR WITH HIGH SENSITIVITY TO LONG WAVELENGTHS

CROSS-REFERENCE TO RELATED APPLICATIONS

This application is a continuation-in-part of U.S. Ser. No. 735,677, filed May 20, 1985 which is a Continuation-in-Part of U.S. Ser. No. 703,083, filed Feb. 19, 1985, both abandoned.

BACKGROUND OF THE INVENTION

The present invention is related to photoreceptors. In particular, the invention is related to photoreceptive materials which are sensitive to wavelengths up to $\lambda \sim 0.9$ $\mu$m.

The spectral response of photoreceptors is very important in determining the type of imaging system in which they can be used. Their overall performance is determined by their spectral sensitivity, or bandgap, and their electronic properties. For example, in systems which utilize light emitted by GaAs lasers or photodiodes it is necessary to have a photoreceptor with a large sensitivity to light of wavelength $>0.85$ $\mu$m. This requires materials with bandgaps which are $<1.45$ eV. The high sensitivity beyond 0.7 $\mu$m also improves the performance of the photoreceptor when used in conjunction with solid state lasers and photodiodes emitting light at $\lambda \sim 0.8$.

Amorphous silicon passivated by hydrogen (a-Si:H) or other elements such as fluorine have been used as photoconductive receptors, electrophotography and image pickup tubes, see, e.g., U.S. Pat. No. 4,394,426, Maruyama et al, Journal of Non-Crystalline Solids 59 & 60 (1983) 1247-1254, North Holland Publishing Company and Imamura et al, Proceedings of the 11th Conference (1979 International) on Solid State Devices, Tokyo, 1979; Japanese Journal of Applied Physics, Volume 19 (1980) Supplement 19-1, pp. 573-577. However, because it has a bandgap of $\sim 1.7$ eV, it has low optical absorption for $\lambda \geq 0.7$ $\mu$m and hence rapidly loses its photosensitivity at these wavelengths. To increase optical absorption of a semiconductor it is necessary to decrease its bandgap and there have been attempts to obtain amorphous semiconductors that have smaller bandgaps and good electronic properties. Amorphous semiconductors based on a-Si:H exist with smaller bandgaps such as a-Si$_x$Ge$_{1-x}$:H alloys in which a bandgap of $\sim 1.5$ eV is obtained with $\sim 50\%$ of Ge present in the films. In order to decrease the bandgap, $E_g$, below 1.5 eV it is necessary to have more than $\sim 50\%$ Ge in the films.

However, it is found that when the fraction of Ge exceeds $\sim 50\%$ by volume and when $E_g$ decreases below $\sim 1.5$ eV there is a large degradation in the electronic properties of the alloy films, see, e.g., G. Nakamura et al Japan J. Appl. Phys. 20, 1981, Suppl. 20-1, p. 291-296; R. L. Weisfield, J. Appl. Phys., 54, (1983) 6401. This degradation seriously limits any potential performance of a-Si:H/a-Ge:H alloys as photoreceptors having high sensitivity to wavelengths from 0.8 to 0.9 $\mu$m.

In a preferred embodiment of the present invention, a photoreceptor member is described which includes material whose bandgap can be selected to make it sensitive to infrared light. The bandgap of the photosensitive material can be reduced below 1.5 eV with a ratio of Ge to Si which is $\lesssim 50\%$ Ge and with sufficiently good electronic properties to make it highly photosensitive to wavelengths up to 0.9 $\mu$m.

SUMMARY OF THE INVENTION

The present invention is a photoconductive member which includes a layer of material capable of carrying charge, adjacent to a multilayered amorphous semiconductor material. The multilayered material is formed from tetrahedrally bonded elements or alloys containing tetrahedrally bonded elements. The composite material may have an adjacent blocking layer on either side or may be sandwiched between two blocking layers. The entire structure is supported by a layer of metal or glass depending on whether the photoconductive member is used in electrophotography or in an image pickup tube.

DESCRIPTION OF THE PREFERRED EMBODIMENTS

The present invention is a photoreceptive member with enhanced sensitivity to infrared radiation. This sensitivity is achieved by incorporating into the photoreceptive member a multilayered material which has high infrared optical absorption and good electronic properties. In a preferred embodiment, the layered material includes alternating thin layers formed from tetrahedrally bonded elements or alloys containing tetrahedrally bonded elements. In a more preferred embodiment, the multilayered material includes alternating thin layers of 1-Si:H and a-Ge:H. Such a material is sometimes referred to as a superlattice, see, e.g., Solid-State Superlattices by G. Dohler, Scientific American, November 1974. If the layers 1, 3, 5 . . . and 2, 4, 6 . . . of the structure have the same thickness then the structure will have a repeat distance of the thickness of layer 1 plus the thickness of layer 2. The present invention shall be illustrated and described by a superlattice having a-Si:H and A-Ge:H layers.

The photoreceptive member is used in electrography and infrared image pickup tubes. The photoreceptive member of the present invention is particularly useful when it is combined with a system that uses a laser or photodiode source of light whose wavelength is in the infrared.

Figure 1:
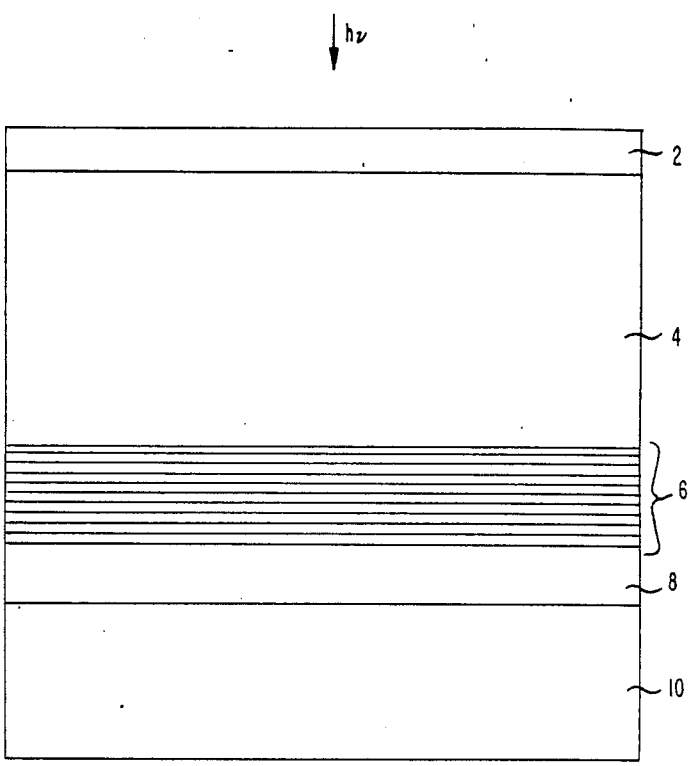
FIG. 1 shows a schematic diagram of one embodiment of the present invention.

FIG. 1 shows a schematic diagram of a preferred embodiment of the photoreceptive member of the present invention. The elements of the member include blocking layers 2 and 8, a material 4 that will carry charge, a multilayered amorphous superlattice 6 and a support 10. Both blocking layers 2 and 8 may not be necessary depending on the other elements of the device as discussed below. As shown in FIG. 1, the photoreceptive member is sensitive to light incident upon blocking layer 2. The layer 6 is substantially thinner than layer 4.

The layer 4 can be an organic or inorganic material which need not be photosensitive to wavelengths beyond 0.7 $\mu$m. It must be a material capable of carrying charge. That is, a material into which charge created by light absorbed in layer 6 can be injected efficiently. Furthermore, this injected charge can be transported across the layer 4 to the opposite surface. The layer 4 may be an organic polymer such as polyester, polycarbonate, or PVK which has charge transport molecules incorporated into it. If in these materials the charge transport is to be by holes then this transport must occur at energy levels which are close to the valence band of layer 6 so that the photogenerated holes in layer 6 can be easily injected into these levels. The layer 4 can also be inorganic material like Se, SeTe, SeTeAs or similar alloys. If the transport in these materials is to be by holes, the valence band of layer 6 must be close to that of layer 6 for efficient injection of holes photogenerated in layer 6. If the material of layer 4 has sufficient resistance ($\gtrsim 10^{12}$ cm$^{-1}$) under operating conditions than it may not be necessary to having a blocking layer adjacent to it (top or bottom).

Figure 2:
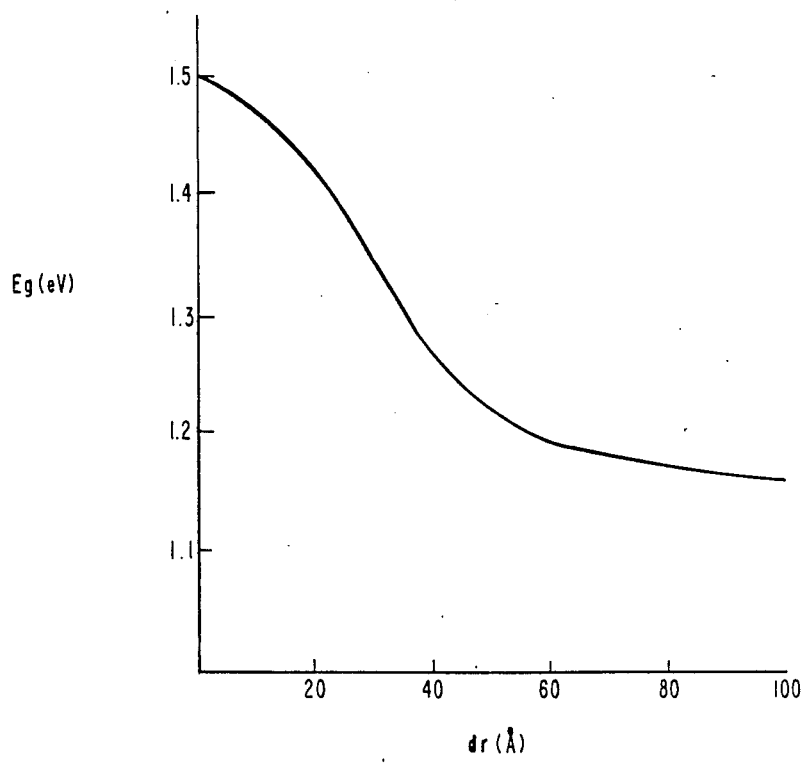
FIG. 2 shows the optical gap, $E_g$, of a-Si:H/a-Ge:H multilayer material as a function repeat distance where the thicknesses of a-Si:H and a-Ge:H are in the ratio of 1.1 to 1.

The photoreceptive member is made sensitive to infrared light by varying the thicknesses of the a-Si and the a-Ge layers of the superlattice between $\sim$5 Å and $\sim$100 Å. The optical gap changes from $\sim$1.5 ev to $\sim$1.1 eV when the repeat distance of the superlattice is increased from $\sim$10 Å to $\sim$100 Å (see FIG. 2). Note that in FIG. 2 $d_r \sim$30 Å gives $E_g \sim$1.3 eV.

Figure 3:
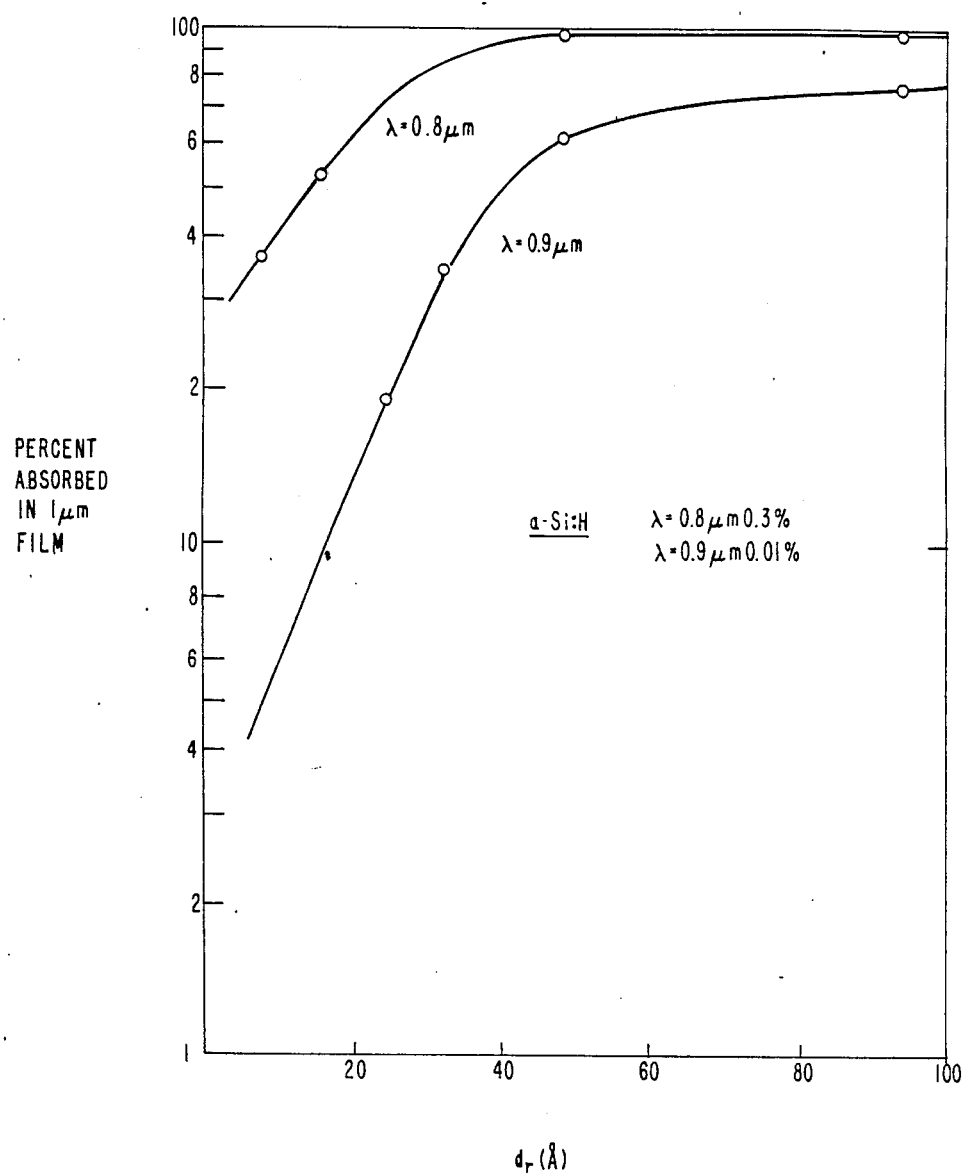
FIG. 3 shows the percentage of light absorbed for $\lambda = 0.8$ and 0.9 $\mu$m in a 1 $\mu$m thick film of a-Si:H/a-Ge:H multilayered material as a function the repeat distance of the a-Ge:H/a-Si:H layers of FIG. 2. Also indicated are the corresponding absorptions for a 1 $\mu$m thick a-Si:H film.

The increase in optical absorption that occurs as the layer thickness is decreased leads to increased absorption of infrared light. Large fractions of incident light at wavelengths from 0.8 to 0.9 $\mu$m are absorbed in films which are only 1 $\mu$m thick. This is illustrated in FIG. 3 which shows the percentage of the incident light of wavelengths 0.8 and 0.9 $\mu$m that is absorbed in a $\sim$1 $\mu$m thick film superlattice materials having different values of $d_r$. (The thicknesses of the a-Si:H and a-Ge:H in the case shown are in the ratio 1.1 to 1.0). Also indicated in the figure are the corresponding values for a 1 $\mu$m thick a-Si:H film having a bandgap of $\sim$1.7 eV.

As may be observed from FIG. 3, only a thin film of a-Si:H/a-Ge:H superlattice material is required to absorb a very large fractions of light at these wavelengths. The sufficiency of such thin films relaxes the requirements on the electronic properties of the superlattices for efficient extraction of photogenerated carriers. The requirement for efficient extraction of carriers is that the photogenerated carrier lifetime $\simeq$ the carrier transit times.

The decrease in bandgap described herein can be also achieved by not having equal thicknesses of the individual a-Si:H, a-Ge:H layers but by having a suitable ratio of $d_{Ge}$ (thickness of Ge) to $d_{Si}$ (thickness of Si).

The thickness of Si in the superlattice, however, is to be kept to less than $\sim$50 Å and preferably $\sim$30 Å. This is in order to allow efficient electron tunneling between adjacent a-Ge layers across the intervening a-Si layer. This is necessary because the bandgap changes in these layered materials result primarily from the movement of the conduction band (electron extended states).

As a consequence, the discontinuity between the valence bands in the Ge and Si are $\lesssim$0.1 eV and the rest of the bandgap difference occurs at the conduction band.

Efficient tunneling occurs for silicon thicknesses of up to $\sim$30 Å with ohmic currents up to average electric fields of $\sim$5$\times$10$^4$ V/cm. At higher fields enhanced transport of electrons through the Si layers is obtained.

The superlattice layer 6 and the semiconductor or insulator 4 may be interchanged thereby placing the superlattice layer 6 adjacent to a blocking layer 2 which is necessary. In this case, because of the dependence of the perpendicular conductivity on tunneling, the conductivity in the plane of the layers can be very much higher than the conductivity perpendicular to them. For high resolution, this parallel conductivity must be low. This can be achieved by having charge depletion in the a-Ge layers or by donor-acceptor compensation so that the Fermi level is at midgap of the a-Ge superlattice.

The photosensitivity of the a-Ge/a-Si superlattice layers in photoreceptors is determined by the optical absorption, transport and lifetimes of the carriers in the perpendicular (transverse) direction to the layers. The properties of the a-Si/a-Ge layered structures, having the individual thicknesses specified, satisfy the requirements that are necessary for enhancing the IR sensitivity of a-Si photoreceptors used in electrophotography. Specifically, a member $\lesssim$1 $\mu$m comprised of these alternating layers can be used to efficiently absorb light from solid state lasers and photodiodes emitting light up to $\sim$0.9 $\mu$m. Furthermore, these photogenerated carriers can be extracted from such members with collection efficiency close to 100% at fields $\lesssim$1$\times$10$^5$ V/cm.

As described above, the layer 4 may be an amorphous material such as a-Si. In addition to a-Si, the layer 4 may be a wide bandgap photoreceptor material with $E_g \geq$2 eV which has good transport properties and appropriate band alignment, i.e., its valence band must match the valence band of the superlattice sufficiently to pass the required hole current. The layer 4 must allow the injected photogenerated carriers to cross the layer to reach the charged surface. The thickness of layer 4 should be between $\sim$10 $\mu$m and $\sim$50 $\mu$m. Such materials presently used in electrophotography include amorphous silicon and selenium and organic polymers.

The substrate 10 depends on the manner of use for the photoreceptor. If the photoreceptor is used in electrophotography then the substrate 10 is metal (may be a metal drum or belt). If the photoreceptor is used in image pickup tubes, the substrate 10 is a transparent material such as glass with a transparent conductivity oxide electrode such as SnO, ITO, CdO, etc.

The properties of the blocking contacts 2 and 8 also depend on how the photoreceptor material is used. Long wavelength radiation will generate electron hole pairs in the layered superlattice 6. Then if, for example, the photoreceptor is used in electrophotography devices wherein a negative corona is used to deposit negative ions on the surface of layer 2, then the layer 2 will be an electron blocking contact (not hole blocking) and layer 8 will be a hole blocking contact (not electron blocking). If the resistivity of layer 4 is sufficient to maintain charge on the surface then it may not be necessary to have a blocking contact 2.

The blocking contact adjacent to the substrate can be a thin layer of doped a-Si:H or an appropriate thin insulating layer such as $SiO_2$, SiC, SiN. The doped a-Si:H must be $n^+$ doped to be blocking for holes and $p^+$ doped to be blocking for electrons. The blocking contact for the corona has to be an appropriate thin insulating layer in order to maintain resolution. Such a blocking contact however may not be necessary if the contact between layer 4 and the corona itself is sufficiently blocking.

If a positive charge is imparted to the surface of layer 2, then layer 2 will be a hole blocking layer and layer 8 will be an electron blocking layer.

The photogenerated electrons and holes will cross the amorphous semiconductor layer 4 just as in present conventional electrophotography devices.

In the embodiment shown in FIG. 1, if the photoreceptor is used with a negative corona, the electrons will have no barrier in going from the superlattice layer 6 to layer 8 and metal substrate 10. With a-Si as material 4 the holes will have a slight barrier, ~0.1 ev, in going from the superlattice layer 6 to the amorphous semiconductor layer 4. If the corona is positive, the layer 2 is hole blocking and layer 8 is electron blocking. In this case, the electrons will have to overcome a small barrier up to ~0.4 eV in order to enter the a-Si amorphous semiconductor layer 4. A large potential across the photoreceptor and high electric fields help the electron to go over this barrier. In addition, by changing the superlattice layer thicknesses the bandgap can be graded (e.g., from ~1.3 to 1.7 eV) to make this transition easier.

An alternate embodiment of the photoreceptor includes the same structure as shown in FIG. 1 except that the superlattice layer 6 may be interposed between layer 2 and layer 4 instead of between layer 8 and layer 4. The operation would be similar as for the structure shown in FIG. 1 depending on whether a positive or negative corona was used. With negative corona the electrons would be injected into the amorphous semiconductor layer 4 and with positive corona the holes would be injected into layer 4.

If the photoreceptor material is used in an image pickup tube, then the substrate 10 is glass with a transparent conducting oxide electrode and light is incident on the material through the glass substrate 10. The layer 2 is charged by an electron beam. The operation is similar to a negative corona electrophotography device described earlier except the electron beam scans the layer 2 every 1/30 of a second.

The thickness of the photoreceptor in this case is from ~2 to 5 μm and, therefore, the superlattice layer 6 is <1 μm.

The transport of photogenerated electrons in the direction parallel to the incident light and perpendicular to the alternating layers is determined by their ability to tunnel from the adjacent a-Ge layers through the a-Si:H intermediate layers and on their recombination rates. The tunneling depends on the thickness of a-Si:H and $E_g$. The recombination is determined by the densities of recombination centers in the a-Ge and the a-Si/a-Ge interfaces (recombination in a-Si is negligible because of the low densities of defects). Therefore, it is very important to have low densities of interface defects because of the many a-Si/a-Ge interfaces present in this member. This can be achieved by layers fabricated under conditions such as described by B. Abeles and T. Tiedje, *B. Abeles, et al., Journal of Non-Crystalline Solids, Vol. 66,* (1984), p. 351, however, it is not limited to such preparation conditions. In particular it may not be necessary for the layered material to be prepared under fabrication conditions which result in interfaces as sharp as those described by Abeles and Tiedje.

Figure 4:
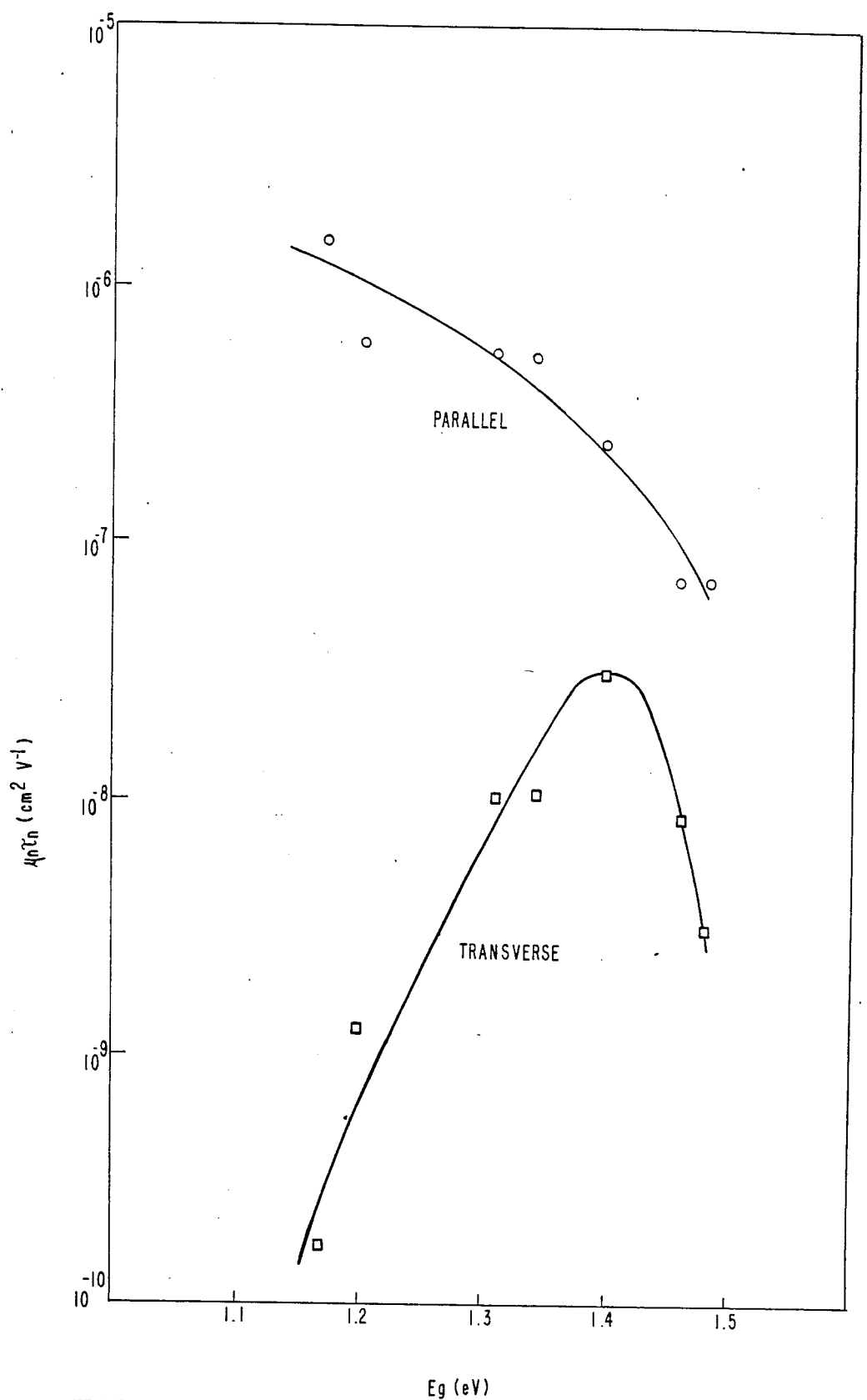
FIG. 4 shows the electron mobility-lifetime products as a function of $E_g$, where $\mu_e$ is electron mobility and $\tau_e$ is electron lifetime, for the a-Si:H/a-Ge:H superlattice material having equal thicknesses of a-Si:H and a-Ge:H. The "Parallel" curve is the case for transport parallel to the layers. The "Transverse" curve is an effective $\mu_e \tau_e$ across the layers for electric fields of $10^4$ V/cm in films about 1 $\mu$m thick.

Because of the dependence of the carrier transport on tunneling it is important to optimize the thicknesses of the a-Si layer for given $E_g$. This thickness cannot exceed 20–30 Å for an $E_g$ of ~1.3 eV. Also, the a-Ge has to be deposited under conditions which result in low densities of deep gap states ($\lesssim 10^{17}$ cm$^{-3}$ eV$^{-1}$). This requires "passivators" such as H or F to saturate dangling bonds. Electron transport of photogenerated carriers determines the photoconductivity of the layered structures shown in FIG. 1. The effective electron $_{e\ e}$ products (for the parallel and transverse directions) for the layered materials having equal thicknesses of a-Si:H and a-Ge:H are shown in FIG. 4 as function of $E_g$. These $\mu_e \tau_e$ products were determined from photoconductive measurements with ohmic contacts. Note the decrease below 1.4 eV in effective $\mu_e \tau_e$ for the transverse direction results from the decrease in electron tunneling that corresponds to a-Si:H thickness ~20 Å. Note also, that these $\mu_e \tau_e$ products $>10^{-8}$ cm$^2$ V$^{-1}$ are comparable to those in high quality a-Si.

The photogenerated hole transport is also determined by recombination. However, because of the small potential barrier between the valence bands of the a-Ge and a-Si (~0.1 eV) the transport at ambient temperatures can proceed by thermal emission over this low barrier. In undoped a-Si/a-Ge layered structures the holes are minority carriers and do not contribute significantly to photoconductivity. However, they become just as important as electrons in determining the operation of the photoreceptors described in our invention. In the invention described herein, high quantum efficiencies at long wavelengths are obtained when both electrons and holes are swept out efficiently from the layered member into the a-Si, into the substrate and to the charged surface of the photoreceptors (similar to solar cells). The ability to sweep out these carriers is determined by the recombination lifetimes of both carriers and the electric field. This ability to be collected can be expressed by a collection width, $X_c$, which is thickness of a layered member from which both photogenerated carriers can be collected. Because with blocking contacts a positive space charge is generated in the layered member, the electric field, E, is not uniform and both its magnitude and the distance over which is extends depends on the voltage.

Figure 5:
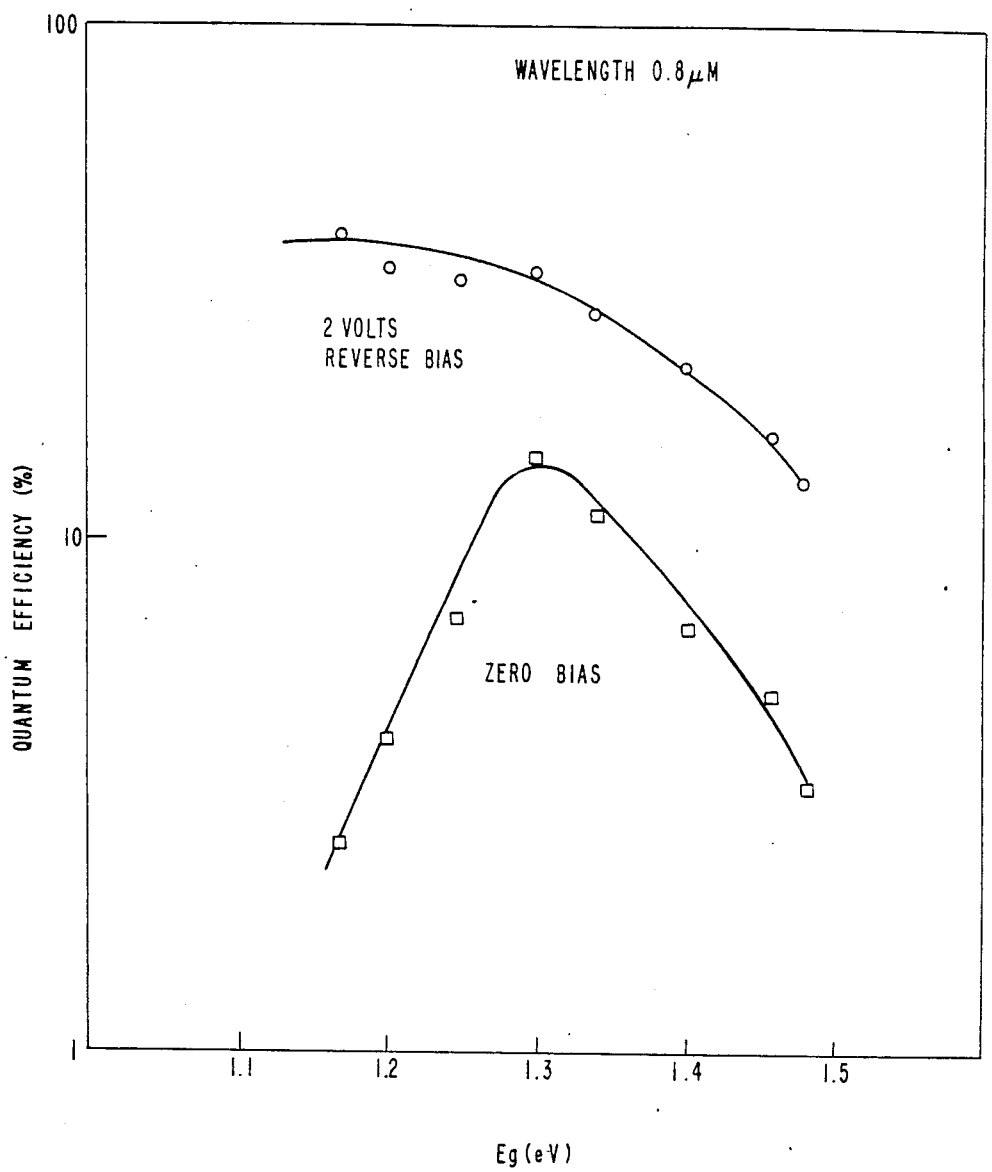
FIG. 5 shows the quantum efficiency (number of carriers collected per entering photon) of the a-Si:H/a-Ge:H superlattices in FIG. 2 as functions of $E_g$ for $\lambda = 0.8$ $\mu$m. These quantum efficiencies were obtained for films 0.7 to 1.0 $\mu$m thick having semi-transparent platinum Schottky barrier contacts. A are collection efficiencies with no voltage applied, B are collection efficiencies with $-2$ volts applied to the platinum.
Figure 6:
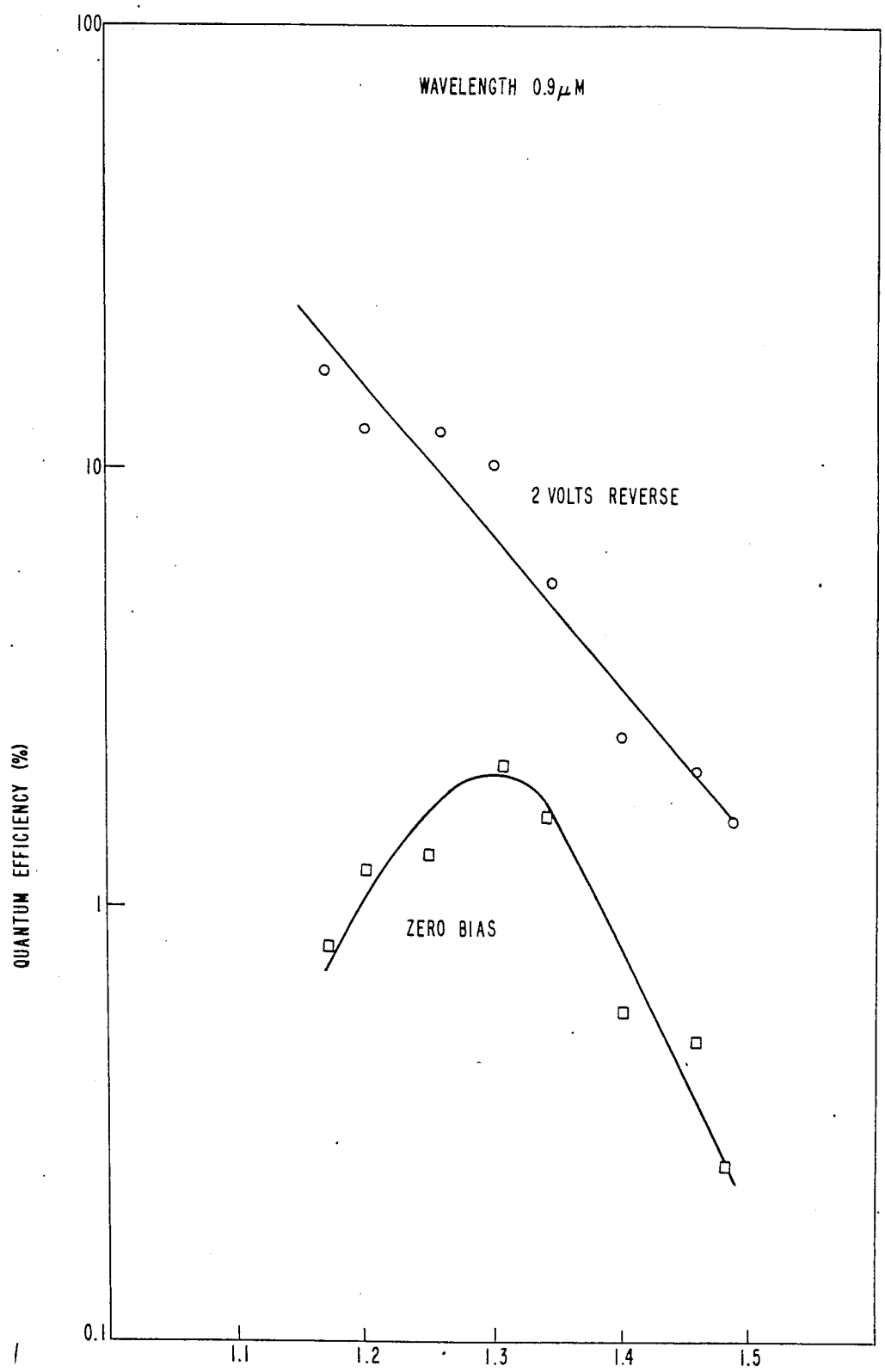
FIG. 6 shows the quantum efficiency of the a-Si:H/a-Ge:H superlattices of FIG. 3 as a function of $E_g$ for $\lambda = 0.9$ $\mu$m. Results A and B under the conditions of FIG. 3.

The ability to efficiently utilize IR long wavelength light in the present invention was demonstrated by measuring the quantum efficiency in films ~1 μm thick which comprised of the a-Si:H/a-Ge:H layers with evaporated platinum as a blocking, Schottky barrier contact (rather than insulating layers with or without thick a-Si films). In these structures efficient carrier collection could be achieved even without any external bias because of the built in potential resulting from the Schottky barrier (~0.4 volts). The thicknesses of the a-Si/a-Ge layered structures were from 0.6 to 1.0 μm. The thicknesses from which photogenerated carriers could be collected depends on the bias. The voltages that could be applied in these experiments were limited by the blocking characteristics of the Schottky barriers which are inferior to thin insulating heterojunction type blocking contacts. The quantum efficiencies, i.e., number of carriers collected per photon entering the layered film for $\mu=0.8$ and $\lambda=0.9$ μm with 0 and $-2V$ reverse bias to the platinum are shown in FIGS. 5 and 6, respectively. The maximum quantum efficiencies that could be obtained in a-Si:H films at these wavelengths for a 1 μm thick a-Si:H film are 0.3% at $\lambda=0.8$ μm and 0.01% at $\lambda=0.9$ μm. It can be seen that for the $E_g=1.3$ eV, even with no external bias, for $\lambda=0.8$ μm the efficiency is 15% and for $\lambda=0.9$ μm with 2 volts reverse bias applied the efficiency is 1000 times higher than for 1 μm of a-Si:H (i.e., 1000=10/0.01).

Figure 8:
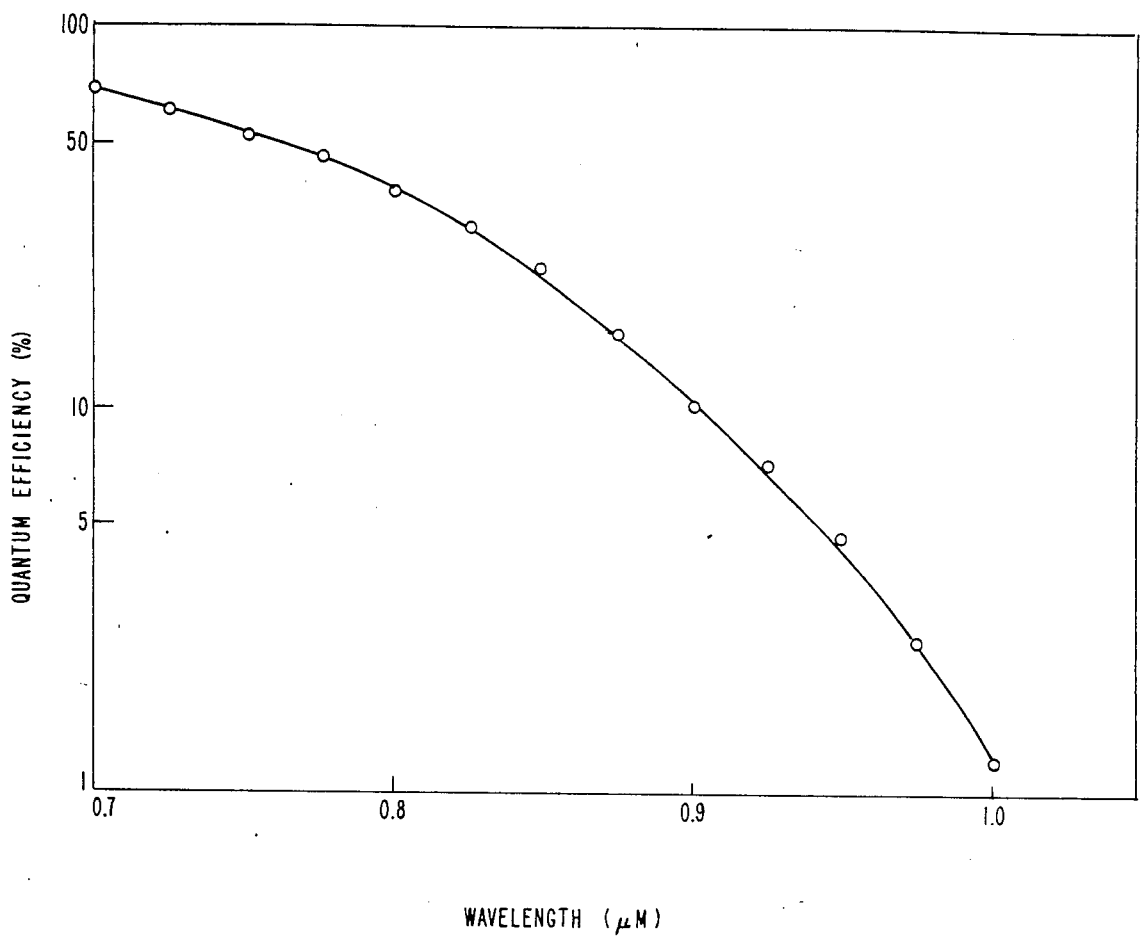
FIG. 8 shows the quantum efficiency as a function of wavelength for material of FIGS. 5 and 6 which has $E_g = 1.36$ eV when $-2$ volts are applied to the platinum.

The high photosensitivity of the layered material over a wide range of wavelengths >0.7 μm is illustrated in FIG. 8. FIG. 8 shows the quantum efficiency as a function of wavelengths for material having $E_g=1.36$ eV. These efficiencies were obtained with $-2$ volts applied to the platinum on a 0.8 μm thick film.

Figure 7:
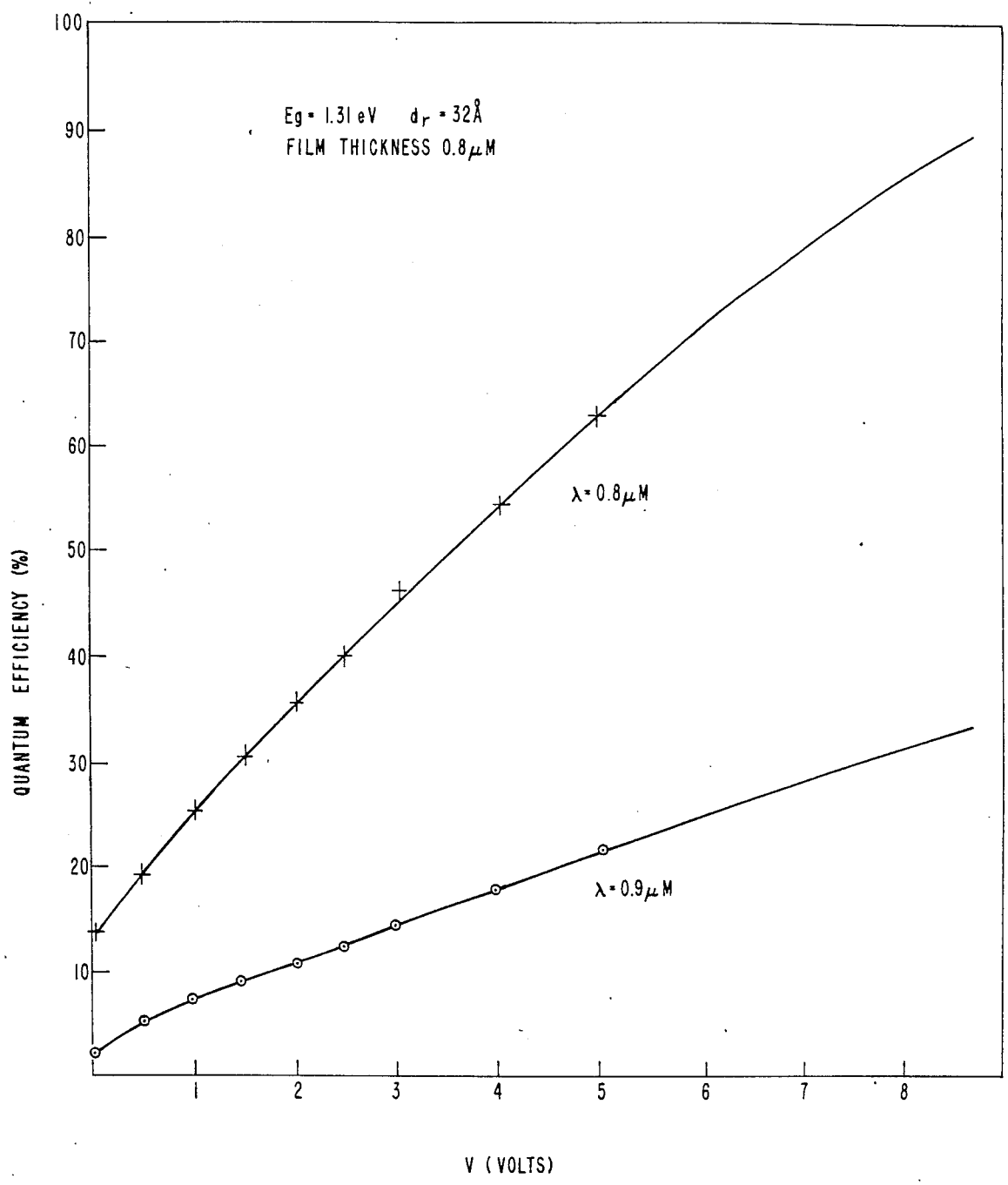
FIG. 7 shows the quantum efficiency of the a-Si:H/a-Ge:H superlattice film of FIGS. 3 and 4, whose $E_g$ is 1.31 eV, as a function of applied voltage for $\lambda = 0.8$ $\mu$m and 0.9 $\mu$m. (Thickness of film is 0.8 $\mu$m).

The collection efficiencies as a function of applied reverse bias for the $E_g=1.31$ eV film having a-Si:H/a-Ge:h layers of 17 Å and 15 Å respectively is shown in FIG. 7. Note that the collection efficiencies increase monotonically with applied voltage across the 0.8 μm film, and with 5 volts the collection efficiency for $\lambda=0.8$ μm is over 60% and for $\lambda=0.9$ μm is over 20%. Because the collection width $X_c$ with 5 volts is 0.5 μm, the mean electric field across $X_c$ corresponds to $1\times 10^5$ v/cm. (This also means that the same quantum efficiency would be obtained with a layered member which is only 0.5 μm thick). The data indicates that if 10 volts were applied with a better blocking contact, the QE for $\lambda=0.8$ μm would be close to 100% and for $\lambda=0.9$ μm about 35% (170 times higher than for a-Si:H 20 μm layer and 3,500 higher than for a 1 μm a-Si:H layer).

In the invention described herein, with an a-Si layer 4 of 20 μm thickness, it would be necessary to charge the receptor to 200 volts in order to obtain these fields of $\sim 10^5$ V/cm across the member. In the invention, because of the close alignment of the valence bands between the layered member and the a-Si, there is no problem to be expected with extraction of photogenerated carriers into a-Si. Also to optimize the extraction of photogenerated carriers from the layered material 6, its thickness should be made equal to the $X_c$ that is present under the operating conditions of the photoreceptor.

What is claimed is:

1. A photoconductive member sensitive to infrared radiation comprising:
   (a) a layer of material capable of transporting charge;
   (b) a superlattice having at least ten layers of amorphous semiconductor material formed from alternating layers of a-Si and a-Ge or alloys thereof adjacent to said layer of material capable of transporting charge, wherein each of said alternating layers is between 5 Å and 100 Å;
   (c) a first blocking layer adjacent to one of said layer of material capable of transporting charge and said multilayered amorphous semiconductor;
   (d) a support layer adjacent to one of said first blocking layer and said material capable of transporting charge.

2. The photoconductive member of claim 1 further comprising a second blocking layer adjacent to the other of said layer of material capable of transporting charge and said multilayered amorphous semiconductor material.

3. The photoconductive member of claim 2 wherein said support layer is metal.

4. The photoconductive member of claim 1 wherein said alternating layers of a-Si and a-Ge are passivated by hydrogen or fluorine.

5. The photoconductive member of claim 1 wherein said layer of material capable of transporting charge is an amorphous semiconductor.

6. The photoconductive member of claim 5 wherein said layer of amorphous semiconductor is a-Si.

7. The photoconductive member of claim 1 wherein said layer of material capable of transporting charge is an organic material.

8. The photoconductive member of claim 7 wherein said organic material is a polymer selected from the group consisting of a polyester, polycarbamate or PVK.

9. The photoconductive member of claim 1 wherein said a-Si is less than 50 Å.

10. The photoconductive member of claim 9 wherein said a-Si is less than 30 Å.

11. The photoconductive member of claim 2 wherein said substrate is transparent to visible light.

12. The photoconductive member of claim 1 wherein the bandgap of said multilayered amorphous semiconductor is less than 1.7 eV.

* * * * *